United States Patent

Barbee, Jr. et al.

[11] Patent Number: 5,538,795
[45] Date of Patent: Jul. 23, 1996

[54] IGNITABLE HETEROGENEOUS STRATIFIED STRUCTURE FOR THE PROPAGATION OF AN INTERNAL EXOTHERMIC CHEMICAL REACTION ALONG AN EXPANDING WAVEFRONT AND METHOD OF MAKING SAME

[75] Inventors: Troy W. Barbee, Jr., Palo Alto; Timothy Weihs, Menlo Park, both of Calif.

[73] Assignee: The Regents of the University of California, Oakland, Calif.

[21] Appl. No.: 275,472

[22] Filed: Jul. 15, 1994

[51] Int. Cl.⁶ ............................................. B32B 9/00
[52] U.S. Cl. .................... 428/420; 428/930; 428/661; 428/615; 428/616; 428/686; 428/215; 228/124.5
[58] Field of Search ........................... 428/615, 616, 428/617, 621, 635, 636, 686, 661, 420, 930, 215; 419/10; 437/190; 228/124.5

[56] References Cited

U.S. PATENT DOCUMENTS

| | | | |
|---|---|---|---|
| 3,625,662 | 12/1971 | Robers | 428/930 |
| 4,162,496 | 7/1979 | Downer | 428/116 |
| 4,482,418 | 11/1984 | Rigby | 428/420 |
| 5,070,036 | 12/1991 | Stevens | 437/190 |
| 5,160,794 | 11/1992 | Wong | 428/661 |
| 5,256,368 | 10/1993 | Oden | 419/10 |
| 5,381,944 | 1/1995 | Makowiecki | 228/124.5 |

OTHER PUBLICATIONS

Journal of Applied Phys, Nov. 15, 1989 vol. 66–No. 10, pp. 5039–5045 (Tamburini).

Primary Examiner—Patrick J. Ryan
Assistant Examiner—Patrick R. Jewik
Attorney, Agent, or Firm—Henry P. Sartorio; Richard B. Main

[57] ABSTRACT

A multilayer structure has a selectable, (i) propagating reaction front velocity V, (ii) reaction initiation temperature attained by application of external energy and (iii) amount of energy delivered by a reaction of alternating unreacted layers of the multilayer structure. Because V is selectable and controllable, a variety of different applications for the multilayer structures are possible, including but not limited to their use as ignitors, in joining applications, in fabrication of new materials, as smart materials and in medical applications and devices. The multilayer structure has a period D, and an energy release rate constant K. Two or more alternating unreacted layers are made of different materials and separated by reacted zones. The period D is equal to a sum of the widths of each single alternating reaction layer of a particular material, and also includes a sum of reacted zone widths, $t_i$, in the period D. The multilayer structure has a selectable propagating reaction front velocity V, where $$V = K(1/D^n) \times [1-(t_i/D)]$$

and n is about 0.8 to 1.2.

7 Claims, 4 Drawing Sheets

IGNITABLE HETEROGENEOUS STRATIFIED STRUCTURE FOR THE PROPAGATION OF AN INTERNAL EXOTHERMIC CHEMICAL REACTION ALONG AN EXPANDING WAVEFRONT AND METHOD OF MAKING SAME

The United States government has rights in this invention pursuant to Contract Number W-7405-ENG-48 between the United States Department of Energy and the University of California for the operation of Lawrence Livermore National Laboratory.

BACKGROUND OF THE INVENTION

1. Field of the Invention

This invention relates to multilayer structures, and more particularly to multilayer structures with selectable, rapidly propagating reaction wave fronts, as well as selectable total energies, adiabatic temperatures, ignition temperatures and ignition powers.

2. Description of the Related Art

Multilayer structures are thin-film materials that are periodic in one dimension in composition or in composition and structure. Composition/structure variation is generated during the synthesis of the structure, which is typically accomplished using atom by atom, atom by molecule, or molecule by molecule technologies. Individual component layers in a multilayer may vary in thickness from one atomic layer (~2 Angstroms) to thousands of atomic layers (>10,000 Angstroms) of a given material. Multilayer structures can be synthesized using elemental, alloy, or compound layers to form both microstructures and combinations of elements/materials that cannot be produced using traditional processing technology.

Multilayers are made by alternate deposition of two or more different materials. After the first few layers, the structure of all the layers of one material are the same. The structure of each material is clearly of importance for the properties of the multilayer, not only in itself, but also for the influence it can have on the structure of the other material. Each material acts as a substrate for the deposition of the other.

The simplest multilayer structures are those which consist of a composition modulation imposed on a single structure. In almost all cases of this type, intermixing can lead to a uniform single phase of the starting crystal structure or atomic geometry.

While compositionally modulated multilayers may be regarded as a single phase, there are examples of two phase multilayers, in which the two materials have different structures and in which simple homogenization is not possible. If two phase multilayers are annealed, one material may diffuse in the other or react with it to yield a third phase. Alternatively, the two materials may be stable in contact with each other.

Whatever type of multilayer structure, the nature of the interfaces is of great significance. The atomic structure and the volume density of the interfaces between alternate layers in a multilayer can control or strongly affect the physical properties of the materials. In particular with regard to power dissipation of a multilayer structure during exothermic mixing of the alternating unreacted layers, both the number per unit volume and atomic structure of the interfaces control the rate at which the alternating elements mix and produce heat. The interface number per unit volume (density) can be controlled by varying the size of the period. The smaller the period, the closer the interfaces to each other and the higher their density. The atomic structure of the interface can be controlled by varying deposition parameters and/or deposition techniques.

Although multilayer structures can be found in equilibrium in natural systems, e.g., dichalcogenides, most artificial metallic multilayers have free energies far in excess of equilibrium and are susceptible to some type of transformation if there is sufficient atomic mobility. Contributing to the excess free energy are the interfacial free energy, the strain energies and excess chemical energy relative to a mixed composition. Stability is clearly important if the special properties of multilayers are to be exploited as deposited.

The simplest type of structural change in a multilayer is diffusional mixing at the interfaces. The increased interfacial diffuseness and the reduced amplitude of the composition modulation may affect many properties. The repeat distance of a multilayer period can also change.

Individual layer materials may show changes in structure. Crystalline layers may amorphize and amorphous layers may crystallize. The amorphorization and crystallization temperatures may be raised or lowered by interactions with the surrounding layers. Polycrystalline layers and mosaic layers may show grain growth. The grain boundaries running perpendicular to the layers are paths for fast diffusion, and they can enhance diffusional mixing and help destroy a compositional modulation.

A further type of structural change is reaction between the materials of the multilayer to give one or more new phases. If the multilayer is composed of elements with a strongly negative enthalpy of mixing, the heat released when the reaction is started with a thermal probe may be sufficient to allow it to proceed unassisted. This has been observed in transition metal/amorphous silicon multilayers. The phase which forms by reaction in a multilayer may itself be metastable.

The possible origins of the distinctive properties of multilayers are, (i) thin film effects, due to the limited thickness of one or more of the layers, (ii) interface effects, arising from the interactions between neighboring layers, (iii) coupling effects between layers of the same type, acting through the intervening layers and (iv) periodicity effects from the overall periodicity of the multilayer.

Multilayer properties can be tailored by controlling the period and structure of the alternate layers. The characteristics of the multilayer which may affect the properties are, (i) layer thickness and its spread (either periodic or non-periodic designs may be desirable), (ii) interfacial structure, including coherency, (iii) the crystal structure and crystallographic orientation (or amorphicity) of the constituent materials, (iii) the grain size in crystalline layers and (iv) the stresses in the layers.

The synthesis of multilayer structures can be accomplished by using techniques in which the product is formed by means of atom by atom processes. Such techniques include physical vapor deposition, chemical vapor deposition, electrochemical deposition, electrolytic deposition, atomic layer epitaxy and in some cases mechanical processing.

Multi-vapor-source configurations are used in the synthesis of metal multilayers with thermal sources. These are directly analogous to molecular beam epitaxy systems except that the sources need not be the Knudsen cell type. In these systems the sources and samples are stationary, the layering is achieved through interruption of the vapor streams to the substrate by the use of a rotating pin wheel or reciprocating shutters. Substrates can be held at temperatures from 4 to about 1300 degrees K. Heating mechanisms include electron beam bombardment and resistive and optical heating. Sample sizes are usually less than 25 cm$^2$ and are dictated by specific system geometries and heating requirements.

Multisource configurations are also used in sputter deposition systems. In these systems the sputter sources are widely separated and the substrates moved past the sources, a single layer being deposited on each pass by a source. Sputter sources are solid materials, atoms or atom clusters being ejected from the solid target into the vapor by bombardment of the target surface with energetic particles. The ejected atoms impinge on a substrate and condense to form a film. In most cases, noble gases are used as the sputter gas, their ions being positively charged. The process is called cathodic sputtering. Ions are formed by establishing a plasma in much the same manner as a glow discharge is formed in a low pressure gas by an electric field between two electrodes. Factors to be considered include sputter source deposition surface coupling, the energy distribution of the sputtered atoms and the geometry of the vapor source substrate configuration.

The sputtering process entails establishing a plasma discharge and imposing a potential of the correct polarity so that ionized gas atoms are accelerated to the cathode surface, where, if of sufficient energy, they dislodge other atoms. These secondary atoms travel from the cathode surface to the deposition surface, being adsorbed to form a deposit.

There has been a limited understanding on the nature of interfacial interactions and on their relationship to the advance of the reaction front resulting from a chemical reaction between layers in the structure. The use of thin foils to investigate the propagation of such a combustion or reaction wave has been demonstrated for a nickel-aluminum system. Initiation of a reaction wave has been found to be triggered by the melting of nickel for a large period structure regardless of the composition of the foil, U. Anselmi-Tamburini and A. Z. Munir, J. Appl. Phys. 66 (10), pp 5039–5045, 1989. Additionally, the combustion synthesis of multilayer nickel-aluminum systems has also been reported by T. S. Dyer and Z. A. Munir, Scripta Metallurgica et Materialia, Vol. 30, No. 10 pp 1281–1286, 1994. However, these investigators have not produced multilayer structures with selectable wavefronts.

Accordingly, there is a need for a multilayer structure that has a selectable chemical reaction wavefront, a selectable initiation temperature by an external energy source and a selectable amount of energy delivered by a reaction of the alternating layers of the multilayer structure. It would be an advantage to provide multilayer structures in which one is able to determine the velocity of the chemical reaction wavefront, the total energy release, the rate of energy release, the adiabatic temperature and the ignition temperature or power for such a wavefront. For a rapid heat source, there is a need to know how fast the wavefront travels which determines the rate at which energy is released by the structure. It would be desirable to provide multilayer structures that can be tailored for different applications depending on their chemical composition and physical structure that control their chemical reaction wavefronts.

SUMMARY OF THE INVENTION

Accordingly, it is an object of the invention to provide a multilayer structure that has a selectable chemical reaction wavefront velocity.

Another object of the invention is to provide a multilayer structure that has a selectable initiation temperature.

Still a further object of the invention is to provide a multilayer structure that has a selectable amount of energy delivered by a reaction of the alternating unreacted layers of the multilayer structure.

Another object of the invention is to provide a multilayer structure that has a selectable chemical reaction wavefront velocity that is initiated at temperatures determined by their physical composition and structure.

Yet another object of the invention is to provide a multilayer structure that has a selectable chemical reaction wavefront velocity of 0.2 m/sec to about 100 m/sec.

Another object of the invention is to provide a multilayer structure that has a selectable wavefront velocity that is proportional to an amount of energy that is generated by the chemical reaction wavefront between first and second alternating layers.

Still another object of the invention is to provide a multilayer structure with an energy release rate constant K, and a selectable chemical reaction wavefront velocity V that is determined by its period D and a sum of reacted zone widths $t_i$ in the period D, where $$V = K(1/D^n) \times [1-(t_i/D)]$$

and n is about 0.8 to 1.2.

Another object of the invention is provide a multilayer structure with a selectable chemical reaction wavefront velocity with a period D, a sum of reacted zone widths ti in the period D, where $D=(1.5 \text{ to } 3.0) \times t_i$, defining a structure having maximum velocity.

Another object of the invention is to provided a multilayer structure with a period D, and the period D includes a sum of reacted zone widths $t_i$, of about 5 to 360 Angstrom and the multilayer structure has a selectable chemical reaction wavefront velocity.

Yet another object of the invention is to provide a multilayer structure with a selectable chemical reaction wavefront with available heats of formation, $\Delta H_f$, of about 10 k joules/mole to 200 k joules/mole and total energies $\Delta H$ that vary as $$\Delta H = \Delta H_f \left[1 - \frac{t_i}{D}\right]$$

and range linearly with sample volume for given D and $t_i$.

Another object of the invention is to provide a multilayer structure that has a selectable chemical wavefront velocity, and an isolation layer positioned between alternating unreacted layers.

The multilayer structure of the invention has a period D for a particular composition of the multilayer structure, and an energy release rate constant K. The multilayer structure includes two or more alternating unreacted layers made of different materials. Each layer is separated by a thin reacted zone. Period D of the multilayer structure is equal to a sum of widths of each single alternating unreacted layer of given composition and a sum of reacted zone widths $t_i$. The multilayer structure has a selectable propagating reaction front velocity V, where $$V = K(1/D^n) \times [1-(t_r/D)]$$

and n is about 0.8 to 1.2.

Multilayer structures of the invention also have selectable initiation temperatures that are attained by application of external energy, as well as a selectable amount of energy that is delivered by a reaction of the alternating unreacted layers of the multilayer structure.

In one embodiment, the multilayer structure has a selectable propagating reaction front velocity V. A first alternating unreacted layer A has a thickness of $t_A$, a second alternating unreacted layer B has a thickness of $t_B$. A reacted zone exists between the unreacted layers A and B with a thickness of $t_{AB}$. The period D of the multilayer structure is equal to $t_A+t_B+2t_{AB}$, and the structure has an energy release rate constant K. The selectable propagating reaction front velocity V can be chosen depending on a number of different parameters, and is highly dependent on the energy available from the chemical reaction between unreacted layers A and B and how fast it can be released. V is expressed as:

$$V = K(1/D^n) \times [1-2t_{AB}/D].$$

and n is 0.8 to 1.2.

The width of $t_{AB}$ can be minimized for increased velocities. As the atoms which constitute unreacted layers A and B are deposited on the substrate, the substrate is maintained at a chilled temperature. This chilled temperature should be less than about 100 to 110 degrees C.

Alternatively, an isolation layer can be positioned between the alternating layers. The isolation layer can suppress up to about 75% of an interfacial reaction between alternating unreacted layers while the alternating unreacted layers are deposited on a substrate, leaving more energy that is available for the chemical reaction between the unreacted layers after the multilayer structure has been formed.

Another method for minimizing interaction between the alternating unreacted layers during the formation of the multilayer structure is to thermalize the atoms or molecules as they are deposited to form the individual unreacted layers, e.g., A and B. This thermalization reduces the kinetic energy of the atoms or molecules in the vapor and thereby reduces their as-deposited energy which can lead to mixing and interactions.

In a specific embodiment of the invention, individual unreacted layers have thicknesses of about 20 to 10,000 Angstroms, the period of the structures being about 50 to 20,000 Angstroms. The propagating reaction front velocity V is dependent on the size of the reacted zone between the layers and the reactive heat that is generated by the reaction of the unreacted layers. Velocity V is proportional to the power generated by the chemical reaction between the alternating unreacted layers.

The reaction between alternating unreacted layers produces a selectable amount of energy. In this regard, the velocity V and the total energy are selectable, depending on the application.

The chemical reaction between the elemental components in alternating unreacted layers determines the energy available. The rate at which the energy is released is directly proportional to the rate at which these atoms react by thermally activated processes or by structurally enhanced mixing. Because these reactions are thermally activated, the higher the sample temperature, the higher the rate of reaction. Additionally, a significant parameter is that the number of atoms in close contact near an interface determines the rate of energy release at a given temperature. The higher the number of interfacial atoms, the higher the rate of heat release. Therefore, the rate of heat release or reaction delivered power is proportional to the interfacial area per unit volume, which is inversely proportional to the period D.

The multilayer structures of the present invention have a selectable reaction front velocity that is controlled by the power delivered to the reaction front by the exothermic chemical reaction to form the compound $A_xB_y$ in a two component structure. Other important material properties include but are not limited to thermal property parameters such as, (i) material density, (ii) material specific heat, (iii) thermal conductivity and (iv) any mechanisms for heat loss during reaction-convection/evaporation/melting.

Because the multilayer structures of the present invention have selectable propagating reaction fronts, they are suitable for a variety of different applications including but not limited to, (i) ignitors, (ii) joining, (iii) new materials, (iv) smart materials and (v) medical devices and treatments.

DETAILED DESCRIPTION OF THE PREFERRED EMBODIMENTS

Multilayer structures of the invention are made of two or more alternating unreacted layers of known composition. Each multilayer structure has a period D for a given composition of the multilayer structure equal to the sum of widths of individual alternating unreacted layers and the sum of reacted zone widths of the composition. Each multilayer structure has an associated energy release rate constant K. An unreacted layer is only counted once in the period D. However, there may be more than one unreacted layer of the same composition in the period. Thus in a multilayer structure that has three different unreacted layers, A, B, and C, the period D is equal to a summation of their three widths, and also includes the widths of reacted zones in the period D. In this example, a reacted zone between unreacted layers A and B is $t_{AB}$, a reacted zone between unreacted layers B and C is $t_{BC}$ and a reacted zone between unreacted layers C and A is $t_{AC}$. In this example, the summation of the reacted zone widths in period D, represented as $t_t$, is the total widths of $t_{AB}+t_{BC}+t_{AC}$. It will be appreciated that the invention can include only two alternating unreacted layers, or an:/number of different unreacted layers.

However, the multilayer structure has a selectable propagating reaction front velocity V, where $$V=K(1/D^n)\times|1-t_t/D)| \quad \text{equation (1)}$$

and n is about 0.8 to 1.2.

The reaction between the different alternating unreacted layers requires the attainment of an initiation temperature, represented as $T_A$. $T_A$ is also selectable and can be in the range of about 200 to 1500 degrees C. In one embodiment the minimum energy to attain $T_A$ is about 1 millijoule in a time period of about 1 millisecond or less. The amount of energy that is delivered by the reaction of the alternating unreacted layers is also selectable. It can be in the range of about 50 joule/g to about 5,000 joule/g.

For ease of discussion, a multilayer structure with two alternating unreacted layers A and B will now be presented. However, it will be appreciated that the invention is not limited to this particular structure.

Figure 1:
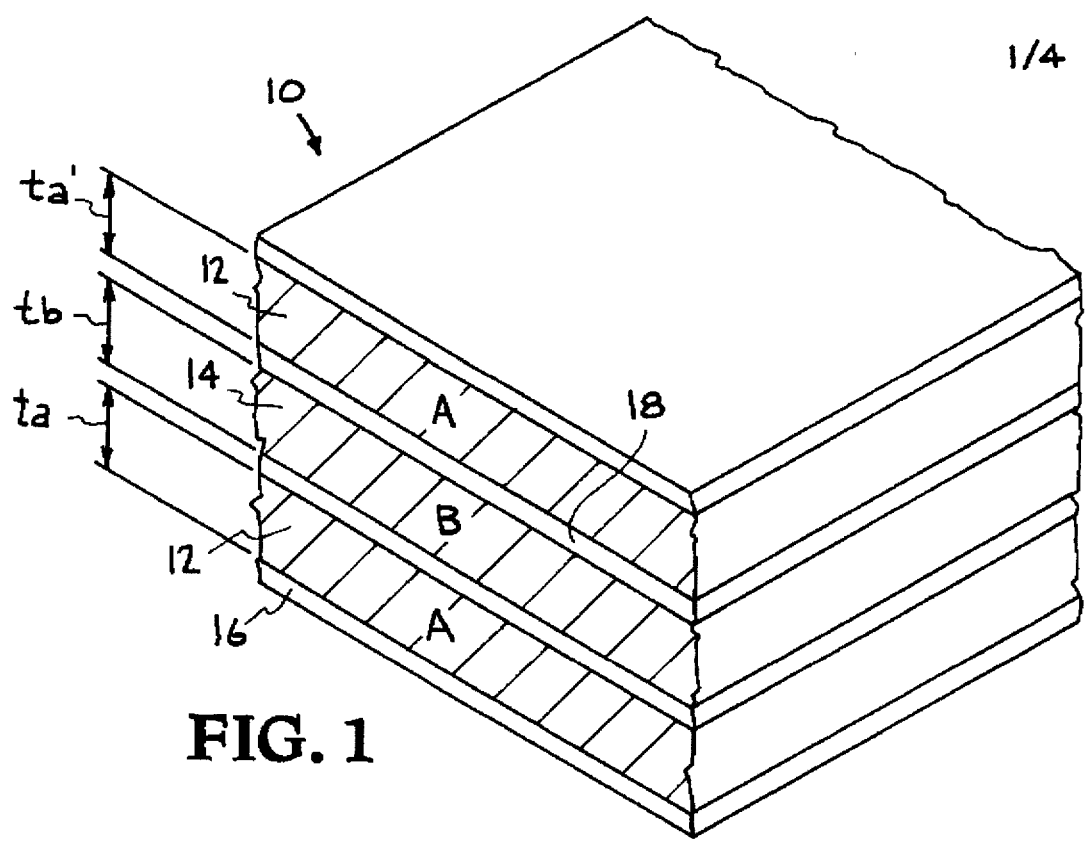
FIG. 1 is a schematic of a multilayer cross section showing interfacial reacted zone of thickness $t_{AB}$ and unreacted layer thicknesses of $t_A$ and $t_B$.

A multilayer structure 10 of the invention is illustrated in FIG. 1 and is formed of a first alternating unreacted layer 12 of a material A with a thickness of $t_A$, a second alternating unreacted layer 14 of a material B with a thickness of $t_B$, that can be deposited on a substrate 16 that can be removed after formation of multilayer structure 10. The unreacted layers can be in the range of 20 to 10,000 Angstroms and can be elemental, alloy or compound layers. A reacted zone 18, generally denoted as $t_{AB}$ is formed between unreacted layers A and B, and has a thickness of $t_{AB}$. $t_{AB}$ can be in the range of about 3 to 180 Angstroms and is preferably as small as possible such as less than 30 Angstroms for highest velocities. The temperature required to initiate the rapid self propagating reaction between unreacted layers A and B can be selected by control of the reacted zone thickness $t_{AB}$ and the multilayer period D. The periodicity of multilayer structure 10 is D, and is defined as the summation of $t_A$, $t_B$ and $2t_{AB}$. Period D is about 50 to 20,000 Angstroms. Multilayer structure 10 has an energy release rate constant K that is dependent on a variety of parameters and varies from structure to structure, as more fully set forth in this specification. Multilayer structure 10 is determined during synthesis by control of the individual component layer thicknesses. The layers may vary from 20 to about 10,000 Angstroms in thickness. The average composition of the samples is controlled by controlling the relative thicknesses of the individual component layers. Multilayer structure 10 has a selectable propagating reaction front velocity V, where $$V=K(1/D^n)\times|1-(2t_{AB}/D)| \quad \text{equation (2)}$$

and n is 0.8 to about 1.2.

K can be about in the range of about 100 to 20,000 mÅ/sec, or 500 to 15,000 mÅ/sec or 1,000 to 10,000 mÅ/sec.

In one embodiment of the invention, the period D is about (1.5 to 3.0)×$2t_i$ for maximum velocity, and $t_i$ is about 5 to 360 Angstroms.

The chemical reaction between the elemental components in unreacted layers A and B determines the energy available. The rate at which the energy is released is directly proportional to the rate at which these atoms react by thermally activated processes or by structurally enhanced mixing. Because these reactions are thermally activated, the higher the sample temperature, the higher the rate of reaction. Additionally, a significant parameter of the invention is that the number of atoms in close contact near an interface determines the rate of energy release at a given temperature. The higher the number of interfacial atoms, the higher the rate of heat release. Therefore, the rate of heat release or reaction delivered power is proportional to the interfacial area per unit volume, which is inversely proportional to period D.

Significantly, multilayer structures 10 of the invention can have propagating reaction front velocities V of about 0.2 m/sec to 100 m/sec. The total energies that are available from such reactions scale with the volume of material and the heats of formation that are, by way of example, listed below.

Propagating reaction front velocity V is selectable in that depending on a variety of different parameters, conditions, and materials, it can be controlled and a desired V obtained. Thus, for different applications, V can vary. V is generally in the range of about 0.2 to 100 m/sec. Heats of formation are about 10 to 200 k joules/mole. For higher energy multilayer structures, including but not limited to NiSi, $VB_2$ and $TiB_2$, the heats of formation are about 70 to 120 kjoules/mole. Mid range heats of formation are about 45 to 70 kjoules/mole. Suitable mid range materials include but are not limited to Monel/Al 400, NiAl, PdAl, TiSn and SnV. Lower range multilayers, such as ZrAl and TiAl, have heats of formation of about 20 to 45 k joules/mole. Heats of formation for various binary alloys and compounds are listed in *Cohesion in Metals: Transition Metal Alloys*, F. R. de Boer et al., Elsevier Science Publishers B. V., 1988, pages 103 through 634, incorporated herein by reference.

The multilayer structures of the present invention have wide spread applications, including use as ignitors, in joining applications, in fabrication of new materials, as smart materials and medical devices and therapies. In the application of ignitors, multilayer structure 14 can be a reaction initiator, wide area heating device or timed explosive initiator. Joining applications include composite/metal joining, semiconductors (low temperature), honeycombs, in field repairs and as a low energy replacement for spot or arc welding or joining with the same material. As new materials, multilayer structure 14 can be used to form single crystal foils of reaction intermetallic compounds, metal matrix composites (intermetallic), and near net form structures (intermetallic). Smart material applications are in the areas of engineering energy release, controlled distortion, light emission signal and sequence processing. They can also be used as very local heat sources in medical therapies and devices.

Suitable multilayer ignitors include Al/Monel 400, NiAl, ZrAl, NiSi, MoSi, PdAl, and RhAl. By way of example, but not intended to limit the invention, an Al/Monel 400 ignitor can be made having a heat of formation of about 55 kcal/mole, V of about 17 to 20 m/sec. However, its sensitivity may be too high at small periods. Another ignitor is $ZrAl_3$, or $ZrAl_2$ each with a heat of formation of about 45 kcal/mole, and V of about 2 to 15 m/sec. An advantage of these materials is that they have lower heats of formation, are less sensitive to smaller periods and require less energy to ignite. The ignitor TiAl has a heat of formation of 33–35 kcal/mole and V of up to 10 m/sec.

Multilayer structure 10 exhibits compound formation with high heats of formation. It can be ignited and a reaction front propages through the structure to form the compound. These reaction velocities may be quite slow but are observed to increase as the size of multilayer period D decreases.

Multilayer structure 10 can be made by a variety of methods well known to those skilled in the art, including but not limited to sputtering in a low vacuum environment. Sputter deposition can occur in a vacuum chamber of a few millitorr of argon. In one embodiment, multilayer structure 10 is formed from two targets of atoms A and B on a substrate maintained at less than about 100 to 110 degrees C. A voltage is applied and an argon plasma sheath induced. Argon atoms are accelerated to the target surface, and transfer mechanical energy to the target atoms which are ejected out and deposit on the substrate. It is desirable to employ a method of deposition which does not impart a great deal of energy to the atoms as they are deposited because this raises the temperature of the deposited layers which in turn increases their mixing. The goal is to deposit the atoms with low energy and with a minimal reacted zone thickness of $t_r$. Another objective of maintaining a low deposition temperature is to minimize the chance of a complete reaction occurring during deposition of the atoms.

Multilayer structures 10 of the invention have a controlled reacted zone thickness and a controlled size of period D. These parameters will vary for a particular material system.

During formation of multilayer structure 10, the incoming atoms have low energy and are thermalized. Additionally, a full or partial isolation layer can be positioned between unreacted layers A and B. This layer permits areas of direct contact between the layers facilitating ignition, and at the same time can suppress up to about 75% of an interfacial reaction between unreacted layers A and B when layers A and B are deposited during synthesis.

Three types of measurements have been made to characterize multilayer structure 10. These include, (i) reaction front velocity V as a function of multilayer structural parameters, (ii) available heat of reaction stored in multilayer structure 10 as a function of structural parameters by Differential Scanning Calorimetry (DSC) and (iii) structural evaluation by planar and cross-section transmission electron microscopy (TEM).

The structure of a multilayer material is determined during synthesis by control of individual component layer thicknesses, $t_A$ and $t_B$. Unreacted layers $t_A$ and $t_B$ may be of thicknesses varying from about 20 to 10,000 Angstroms. The average composition of such a sample is controlled by controlling the relative thickness of the individual component layers A and B. The period D of multilayer structure 10 is defined as $$D = t_A + t_B + 2t_{AB} \quad \text{equation (3)}$$

The average composition is denoted as $A_xB_y$, where $$X = \frac{n_A}{n_A + n_B} \quad \text{equation (4)}$$

where:

$n_A = t_A N_A$, and $n_B = t_B N_B$;

$N_A$ = the number of atoms of A per $cm^3$;

$N_B$ = the number of atoms of B per $cm^3$;

$n_A$ = the number of atoms of A per $cm^2$ for a layer of thickness $t_A$;

$n_B$ = the number of atoms of B per $cm^2$ for a layer of thickness $t_B$.

It is the average $A_xB_y$ composition that determines the maximum energy available to drive the reaction.

By control of relative layer thickness, the average composition of a multilayer material can be defined.

Figure 2:
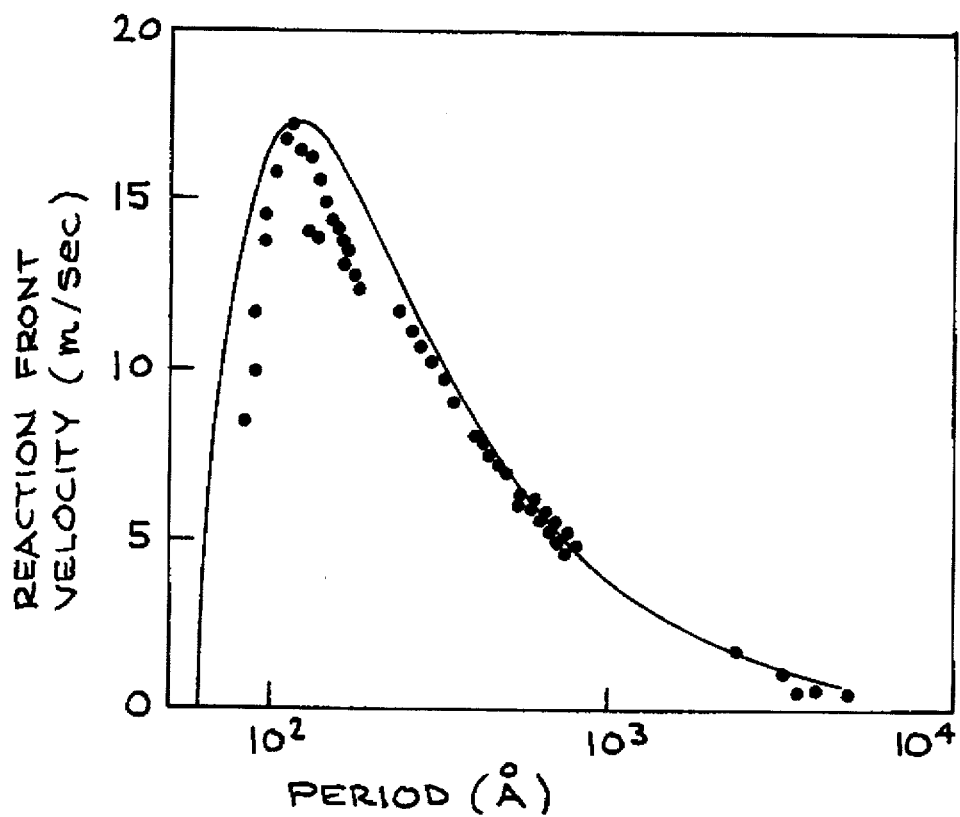
FIG. 2 is a graph of reaction velocity as a function of multilayer period D for an Al/Monel 400 structure.

The reaction front velocity V dependence on multilayer period D is shown in FIG. 2 for an Al/Monel 400—multilayer designed to form a compound analogous to the equiatomic compound NiAl. This compound has a heat of formation of about 50 to 55 k joules/mole. It is clear from FIG. 2 that the velocity increases rapidly as the multilayer period D decreases below 1000 Angstroms.

As depicted in FIG. 2, the velocity increases with decreasing multilayer period D, reaching a maximum at very small periods, then rapidly falling to a small value or about zero. This velocity dependence of the propagating reaction front on structure is a significant observation.

The general qualitative explanation for this dependence of velocity on structure is as follows. First, the chemical reaction between the elemental components in unreacted layers A and B determines the energy available and if the reaction is adiabatic, the maximum temperature attained. Second, the rate at which the energy is released is directly proportional to the rate at which these atoms react by thermally activated processes or by structurally enhanced mixing. Since these reactions are thermally activated, the higher the sample temperature, the higher the rate of reaction. The number of atoms in close contact between an unreacted layer A to an unreacted layer B at an interface in a multilayer structure determines the rate of energy release at a given temperature. The higher the number of interfacial atoms, the higher the rate of heat release. Therefore, the rate of heat release, or reaction delivered power, is directly proportional to the interfacial area per unit volume, or inversely proportional to the period D. Higher energy release rates result in higher temperature gradients at the reaction front and higher propagation velocities. At very small periods, D<150 Angstroms, chemical reactions that occur at the interfaces between alternating unreacted layers, such as A and B, during synthesis causes the available energy to be decreased. With less heat released over any time period, the temperature gradients at the reaction front and the propagation velocity V are smaller.

Figure 3:
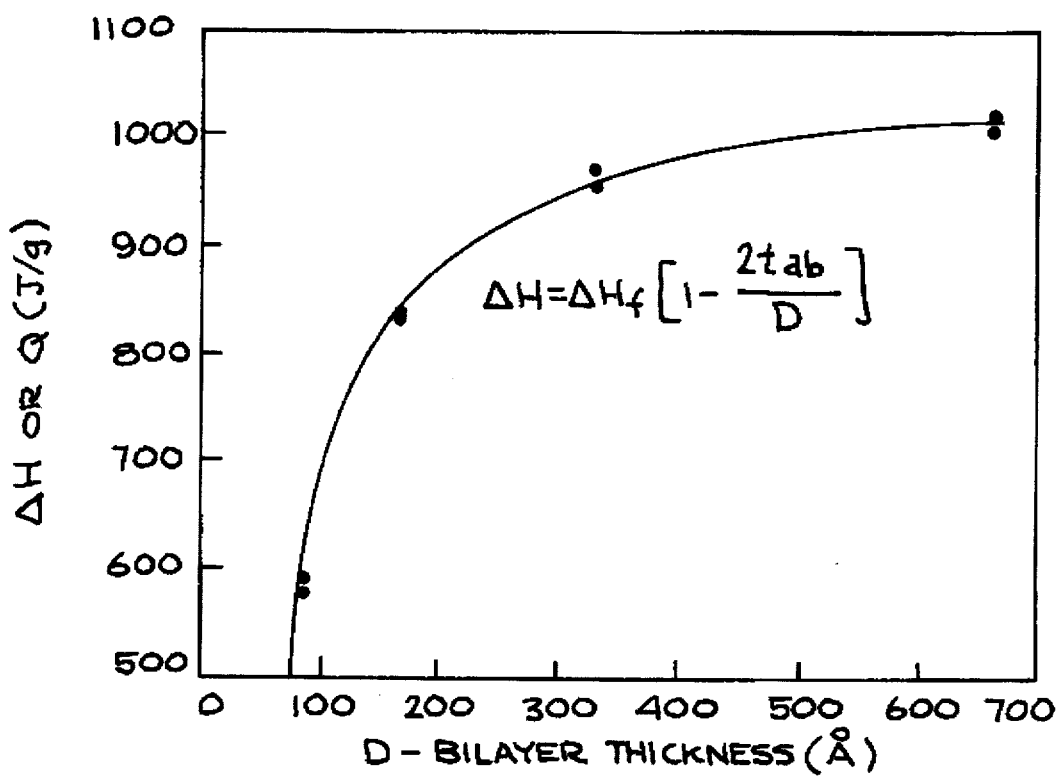
FIG. 3 is a graph of exothermic heat of reaction as a function of multilayer period D for the Al/Monel 400 structure.

Differential scanning calorimetry was used to measure the heats involved with reactions in multilayers as a function of temperature. In one case the exothermic heat liberated by the chemical reaction was measured between the elements in the Monel 400 composition ($Ni_{0.7}Cu_{0.3}$) and aluminum layers as a function of multilayer period. This is illustrated in FIG. 3. The decrease in the available energy (exothermic heat) as the period D is decreased explains the velocity decrease with multilayer period at periods less than 130 Å as shown in FIG. 2.

Figure 4:
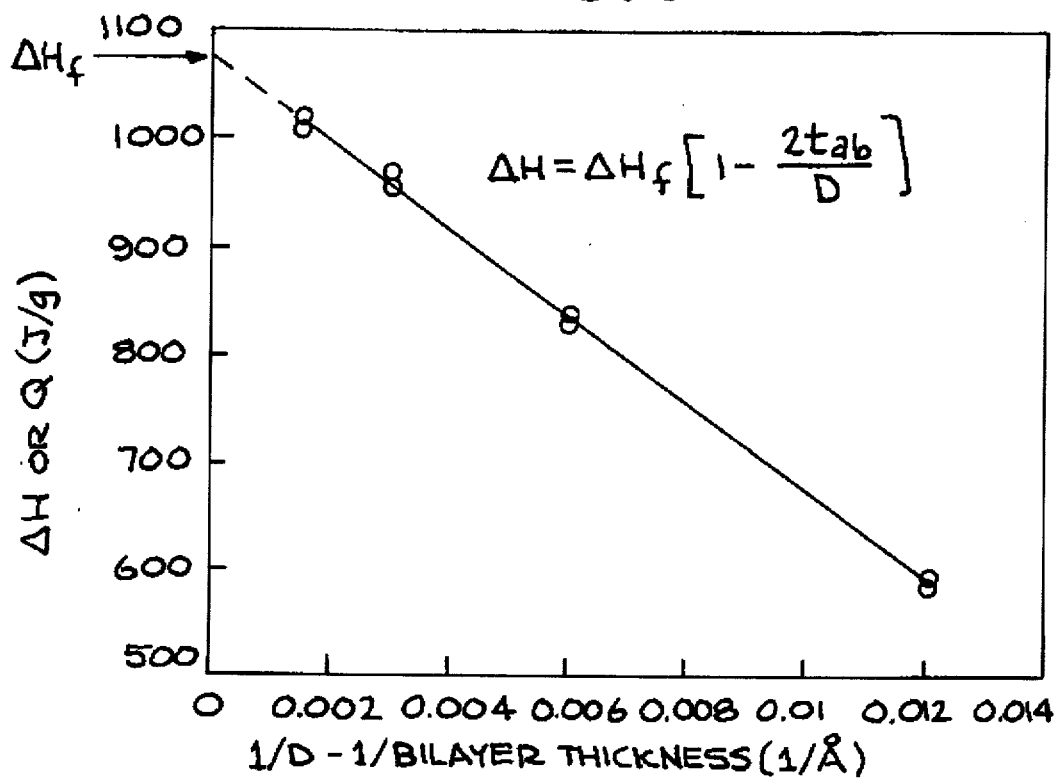
FIG. 4 is a graph of the heat of reaction as a function of 1/D, the inverse of the multilayer period, for an Al/Monel 400 structure.

Again with a multilayer structure with alternating unreacted layers A and B, the available energy, ΔH, is given as $$\Delta H = \Delta H_f \left[ 1 - \frac{2t_{AB}}{D} \right] \quad \text{equation (5)}$$

where $\Delta H_f$ is the heat of formation of compound $A_xB_y$. Assuming that $t_{AB}$ is constant for all multilayer periods, when $$D = 2t_{AB} \quad \text{equation (6)}$$

the driving energy for rapid reaction front propagation goes toward zero and the reaction front velocity is quenched to zero as seen in FIG. 2. By plotting ΔH as determined by DSC at fixed composition as a function of multilayer period 1/D, ΔH can be extrapolated to zero, and the value of D for $2t_{AB}/D$ equal one can be determined. This is shown in FIG. 4, where values of $2t_{AB}$ are estimated between 60 and 90 Angstroms. When $2t_{AB}$ equals D it is implied that the reacted layers of thickness $2t_{AB}$ comprise the full structure and no exothermic energy remains. It is recognized that there will still be a small amount of exothermic energy available as the chemical mixing proceeds to a more stable state in these reacted zone layers of thickness $t_{AB}$.

Multilayer structure 10 dependence of the reaction front velocity is presented in FIG. 2. A qualitative argument that the front velocity is proportional to 1/D is also made. The general form of the data in FIG. 2 can be fit by the equation $$V = K\left(\frac{1}{D}\right)\left[1 - \frac{2t_{AB}}{D}\right] \quad \text{equation (7)}$$

Figure 8:
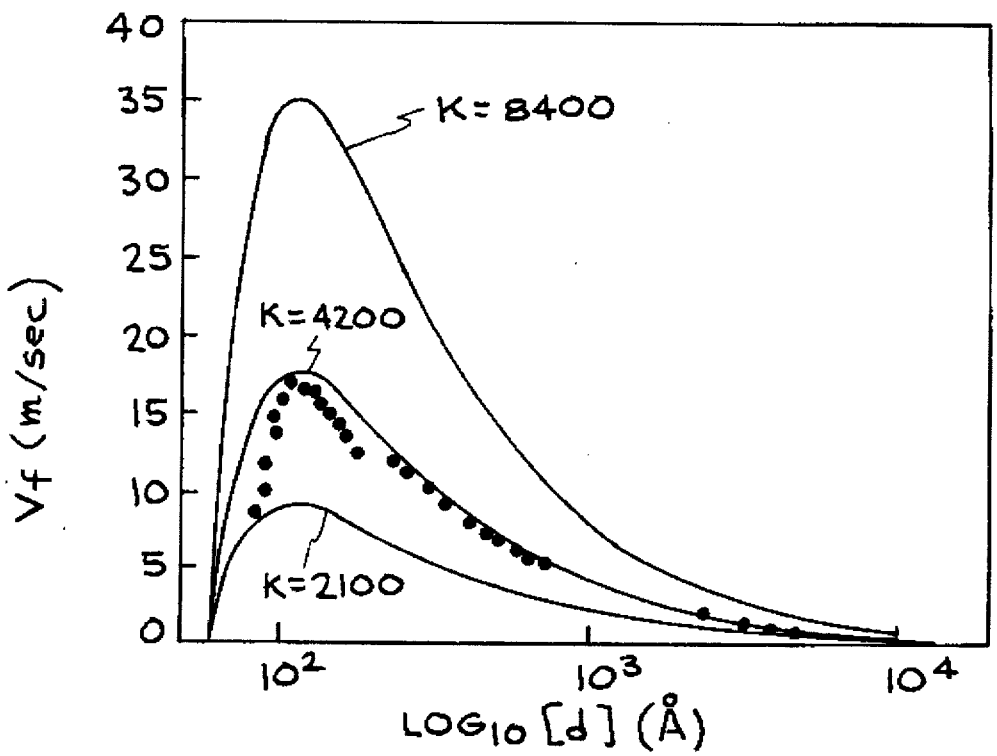
FIG. 8 is a graphical comparison of measured reaction front velocity as a function as the multilayer period D for Al/Monel 400 multilayer structures with calculated reaction front velocities for K values of 8400, 4200 and 2100 mÅ/sec.

A reasonable fit of data is shown in FIGS. 2 and 8.

In equation 7, the term in brackets is just the fraction of the exothermic energy available for a multilayer of period D. The 1/D dependence defines the time over which the reaction occurs. As D decreases, the higher the rate of reaction at a given temperature and the higher the exothermic power. The constant K describes the magnitude of the exothermic energy that is available per volume and relates itself and the other two parameters to the reaction velocity V. While K is strongly dependent on a multilayer structure's heat of formation, it is also dependent on other parameters such as heat capacity and mass density of the multilayer structure.

The reaction front velocity of the multilayer structures of the invention is proportional to the power (energy/unit time) available from the reaction of unreacted layers A and B to form $A_xB_y$.

Figure 5:
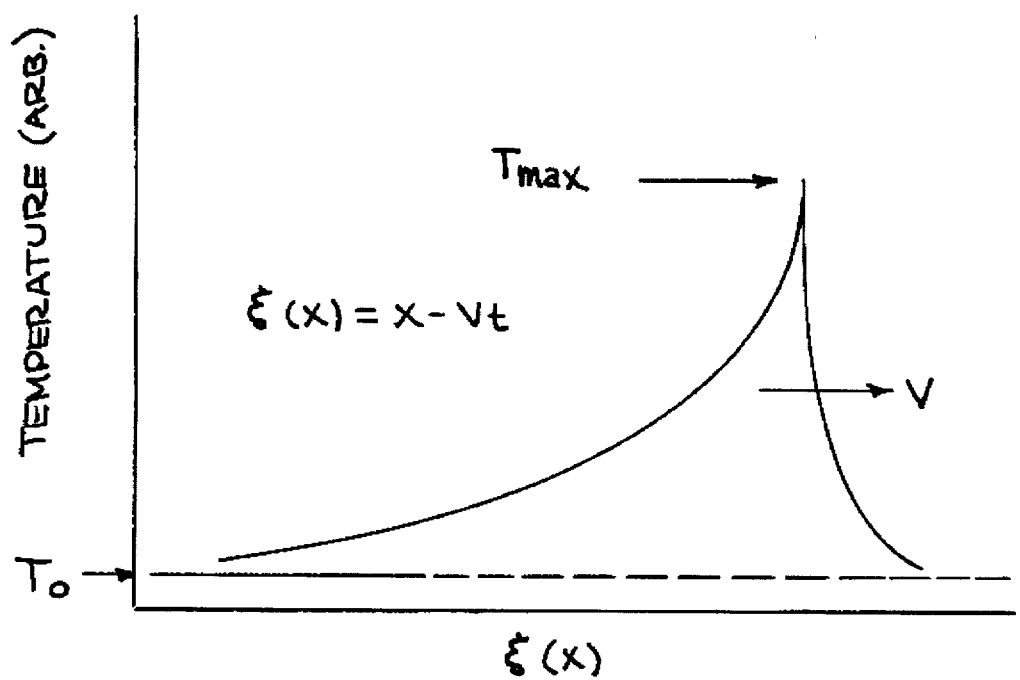
FIG. 5 is a schematic representation of the temperature distribution about the reaction front heat source for a multilayer structure.

Power delivered, $\mathring{Q}$, is assumed constant. The calculated temperature distribution about the reacted front heat source is schematically shown in FIG. 5, where $\xi = X - Vt$ where V is reaction front velocity, X is position and t is time. The calculated temperature T is described by the following equation:

$$T - T_0 = \quad \text{equation (8)}$$

$$(T - T_0)_{MAX} \exp\left[-\left(\sqrt{\left(\frac{V}{2\frac{k}{\rho c_p}}\right)^2 + \frac{hc}{kA}} + \frac{V}{2\frac{k}{\rho c_p}}\right)\right]$$

where $$(T - T_0)_{MAX} = \frac{\mathring{Q}}{2kA\sqrt{\left(\frac{V}{2\frac{k}{\rho c_p}}\right)^2 + \frac{hc}{kA}}} \quad \text{equation (9)}$$

where:

$T_o$ is the starting temperature;

P=density;

$c_p$=specific heat;

k=thermal conductivity;

h=heat transfer coefficient;

c=circumference;

A=cross-sectional area.

The term hC/KA is a heat loss term. For ease of discussion it is assumed that the process is adiabatic and this term is negligible or zero. Equation 9 can be solved for velocity V, giving $$V = \frac{\mathring{Q}}{\rho c_p(T - T_0)_{MAX}} \quad \text{equation (10)}$$

where $$\mathring{Q} = \frac{dE}{dt} \propto \frac{1}{D}\left[1 - \frac{2t_{AB}}{D}\right] \quad \text{equation (11)}$$

The width of a reacted zone in a multilayer can be described by thermally activated atomic diffusion of the two reacting species, A and B, of unreacted layers of thickness $t_A$ and $t_B$. The time/temperature dependence of the growth of the reacted zone width, termed $\omega$, is $$\frac{d\omega}{dt} = \frac{1}{\omega} f\frac{\tilde{D}\exp(-E/RT)}{x(1-x)} \quad \text{equation (12)}$$

where $\omega = t_{AB}$ initially. f is the fractional composition range spanned in the reacted zone of width, $\omega$, and $\tilde{D}$ is the average interdiffusion coefficient in the compound formed and is given as $\tilde{D} = (1-X)D_A + XD_B$ where $D_A$, $D_B$ are the interdiffusion coefficient for component atoms A and B in the compound formed.

This analysis can be used to show that the rate of mixing has an exponential dependence on temperature. The analysis can also be used to demonstrate that the time required to complete the mixing and reaction of a multilayer structure is proportional to the period D. Thus, the rate of heat release, $\mathring{Q}$, is proportional to 1/D.

Equation 12 states that the rate of growth of the reacting layer, $d\omega/dt$, is inversely proportional to the reacted zone thickness $\omega$. Therefore the rate of reaction or rate of exothermic heat release at a given temperature is inversely proportional to the initial reacted zone layer thickness. It is therefore possible, by control of the initial reacted layer thickness, to control the temperature which is required to initiate the propagation of a multilayer material reaction front.

Figure 6:
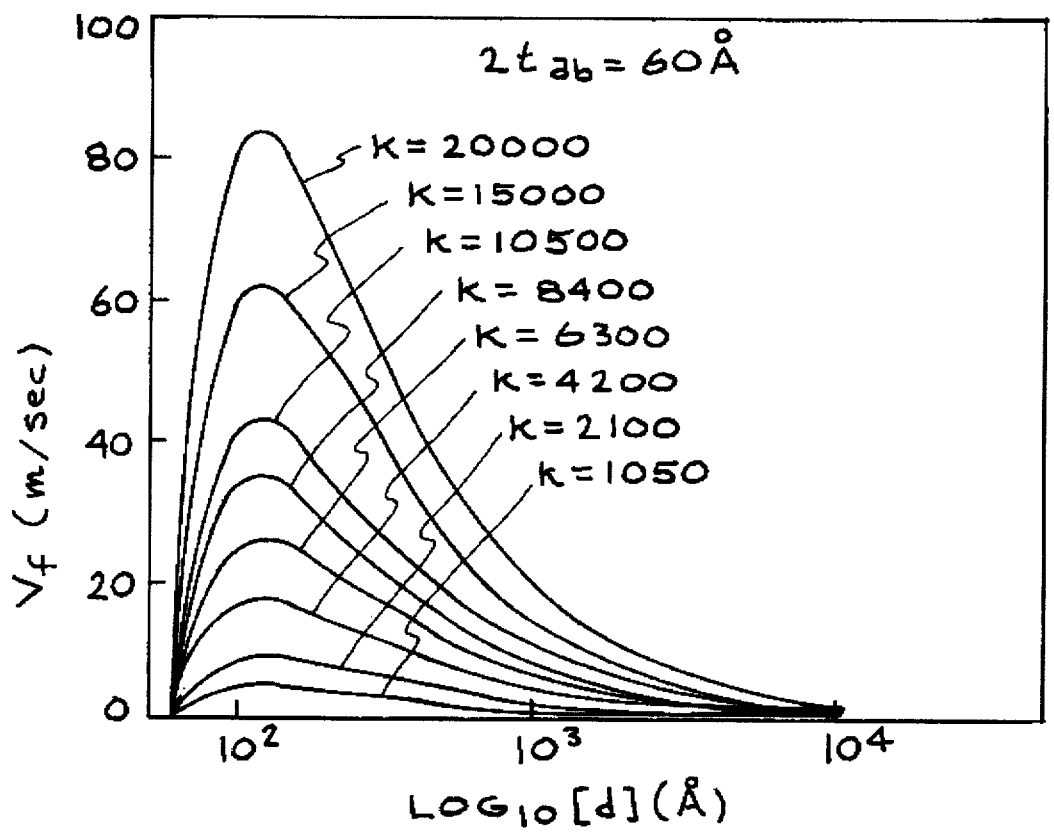
FIG. 6 is a graph of calculated reaction front velocity as a function of the multilayer period for different energy release rate constants K, for a given reacted zone thickness $t_{AB}$.
Figure 7:
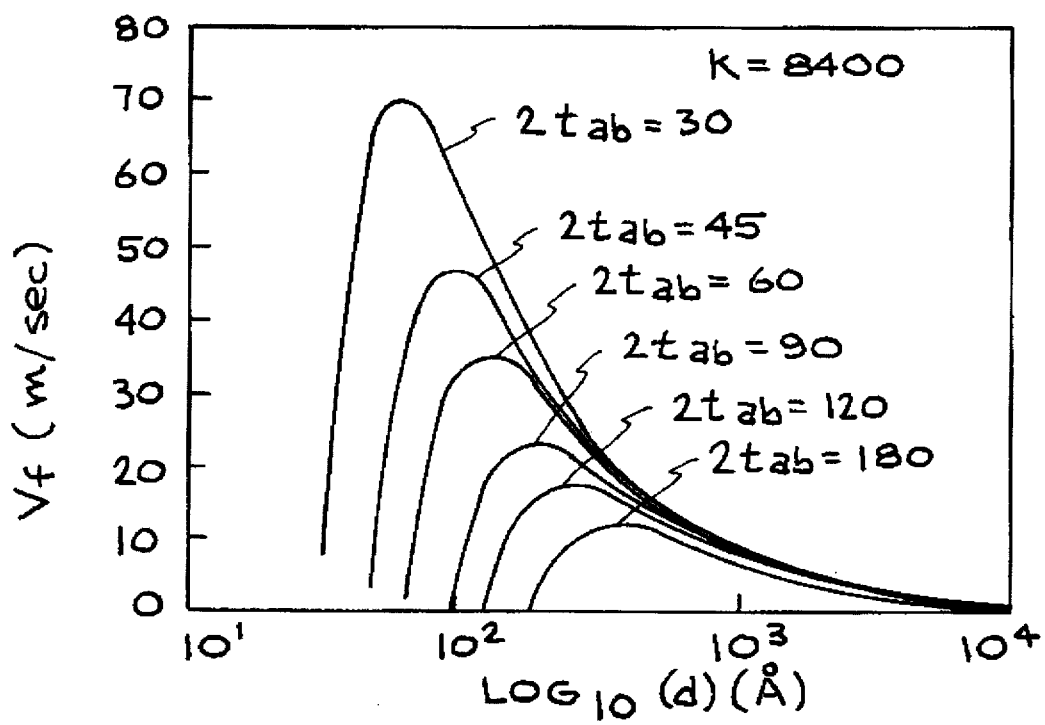
FIG. 7 is a graph of calculated reaction front velocity as a function of the multilayer period D for different reacted zone thicknesses $t_{AB}$, for a given energy release rate constant K of 8400 mÅ/sec.

As shown in FIG. 6, for a given reacted zone $t_{AB}$ with thickness of about 60 Angstroms, variations in K produce significant variations in velocity. For a given constant K of 8,400 mÅ/sec, for a particular multilayer structure, $t_{AB}$ can vary and velocity V changes, as shown in FIG. 7 where $2t_{AB}$ is in the range of 30 to 180 Angstroms. FIG. 8 is a graphical comparison of measured velocity as a function as the multilayer period D for Al/Monel 400 multilayer structures with calculated K values of 8400, 4200 and 2100 mÅ/sec.

The engineering of rapidly reacting multilayer structures with controlled propagating reaction front velocities V is dependent on the following parameters:

(1) the heat of formation of the compound formed by reaction of the component layers;

(2) the reacted zone width formed during synthesis;

(3) the specific heats of the components;

(4) values of endothermic heats of reactions or melting;

(5) thermal conductivity; and (6) interdiffusion kinetics.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

I claim:

1. An ignitable heterogeneous stratified structure for supporting the propagation of an internal chemical reaction along an expanding wavefront from an ignition starting point, comprising:

alternating stratiforms of a first exothermic-constituent material and a second exothermic-constituent material fused together as a whole with a mutual interface of said first exothermic-constituent material reacted with said second exothermic-constituent material, wherein said first exothermic-constituent material independently has a uniform thickness "$t_a$" in the range of 20–10,000 Å (0.002–1.0 µm), said second exothermic-constituent material independently has a uniform thickness "$t_b$" in the range of 20–10,000 Å (0.002–1.0 µm), said interface of reacted first and second exothermic-constituent materials independently has a thickness "$t_i$" in the range of 3–180 Å (0.0003–0.018 µm, wherein a recurring interval "D" that can occur more than once in a single structure is equal to $t_a+t_b+2t_i$ and is in the range of 50–20,000 Å (0.005–2.0 µm);

wherein said first and second exothermic-constituent materials are limited to materials that can entirely provide between themselves a self-sustained exothermic chemical reaction once started by an externally-sourced ignition; and said stratified structure is capable of creating a predictable velocity "V" in the range of 0.2–100 meters per second that depends on the relative proportions of said thicknesses of said first and second exothermic-constituent materials "$t_a$" and "$t_b$", and said thickness "$t_i$" of said interface of reacted first and second exothermic-constituent materials, expressed mathematically as, $$\frac{K\left(1-\frac{2t_i}{D}\right)}{D^n} = V,$$

where said recurring interval "D" equals $t_a+t_b+2t_i$, "K" is an energy release constant having a range of 100–20,000 meters Å/sec, and the exponent "n" is a constant that ranges from 0.8 to 1.2.

2. The structure of claim 1, wherein the stratified structure is such that a maximum velocity "V" of said expanding internal chemical reaction wavefront is provided by limiting "D" to the range of $6.0\ t_i \geq D \geq 3.0\ t_i$.

3. The structure of claim 1, wherein the stratified structure is capable of creating said ignition starting point with an ignition temperature "$T_a$" in the range of 200° C.–1500° C. with total energies ΔH in the range of 50–5,000 joules per gram, expressed mathematically as, $$\Delta H = \Delta H_f\left(1 - \frac{2t_i}{D}\right).$$

4. The structure of claim 1, wherein the stratified structure is capable of creating said internal chemical reaction with predictable available heats of formation $\Delta H_f$ in the range of 10K–200K joules per mole that are dependent on particular relative thickness combinations of said first and second exothermic-constituent materials "$t_a$" and "$t_b$", and said interface of reacted first and second exothermic-constituent materials "$t_i$", expressed mathematical as, $$\Delta H = \Delta H_f\left(1 - \frac{2t_i}{D}\right),$$

where ΔH=total energy.

5. The structure of claim 1, further comprising:

an isolation stratum interposed and fused between the alternating stratiforms of said first and second exothermic-constituent materials fused together as a whole, and providing for attenuation of said internal chemical reaction.

6. The structure of claim 1, wherein said first and second exothermic-constituent materials comprise thermalizations of their respective elemental atoms and/or molecules providing for a reduction of as-deposited energy.

7. The structure of claim 1, wherein said first exothermic-constituent material and said second exothermic-constituent material are selected to form chemical reactions resulting in at least one of NiSi, $VB_2$ and $TiB_2$ for heats of formation in the range of 70K–120K joules per mole, MONEL/Al 400, NiAl, PdAl, TiSn and SnV for heats of formation in the range of 45K–70K joules per mole, and ZrAl and TiAl for heats of formation in the range of 20K–45K joules per mole.

* * * * *

REEXAMINATION CERTIFICATE (4045th)

United States Patent [19]
Barbee, Jr. et al.

[11] B1 5,538,795
[45] Certificate Issued Apr. 18, 2000

[54] IGNITABLE HETEROGENEOUS STRATIFIED STRUCTURE FOR THE PROPAGATION OF AN INTERNAL EXOTHERMIC CHEMICAL REACTION ALONG AN EXPANDING WAVEFRONT AND METHOD MAKING SAME

[75] Inventors: Troy W. Barbee, Jr., Palo Alto; Timothy Weihs, Menlo Park, both of Calif.

[73] Assignee: The Regents of The University of California, Oakland, Calif.

Reexamination Request:
No. 90/005,322, Apr. 6, 1999

Reexamination Certificate for:
Patent No.: 5,538,795
Issued: Jul. 23, 1996
Appl. No.: 08/275,472
Filed: Jul. 15, 1994

[51] Int. Cl.$^7$ ..................................................... B32B 9/00
[52] U.S. Cl. ......................... 428/420; 428/930; 428/661; 428/615; 428/616; 428/686; 428/215; 228/124.5
[58] Field of Search .................................. 428/607, 615, 428/616, 617, 621, 635, 636, 686, 661, 420, 950, 641; 928/215; 419/10; 437/190; 228/124.5, 178; 148/500, 515, 516

[56] References Cited

U.S. PATENT DOCUMENTS

4,783,379  11/1988  Wichersham et al. .................. 428/607

OTHER PUBLICATIONS

Tamburini et al., "Propagation of a solid state combustion wave in NiAl foils", Journal of Applied Phys. vol. 66, Nov. 15, 1989, pp. 5039–5045.
Hardt, A. P. and Phung, P.V., "Propagation of Gasless Reactions in Solids—I. Analytical Study of Exothermic Intermetallic Reaction Rates," *Combustion and Flame* 23, 77–89 (1973) (no month).

*Primary Examiner*—Deborah Jones

[57] ABSTRACT

A multilayer structure has a selectable, (i) propagating reaction front velocity V, (ii) reaction initiation temperature attained by application of external energy and (iii) amount of energy delivered by a reaction of alternating unreacted layers of the multilayer structure. Because V is selectable and controllable, a variety of different applications for the multilayer structures are possible, including but not limited to their use as ignitors, in joining applications, in fabrication of new materials, as smart materials and in medical applications and devices. The multilayer structure has a period D, and an energy release rate constant K. Two or more alternating unreacted layers are made of different materials and separated by reacted zones. The period D is equal to a sum of the widths of each single alternating reaction layer of a particular material, and also includes a sum of reacted zone widths, $t_i$, in the period D. The multilayer structure has a selectable propagating reaction front velocity V, where $$V = K(1/D^n) \times |1-(t_i/D)|$$

and n is about 0.8 to 1.2.

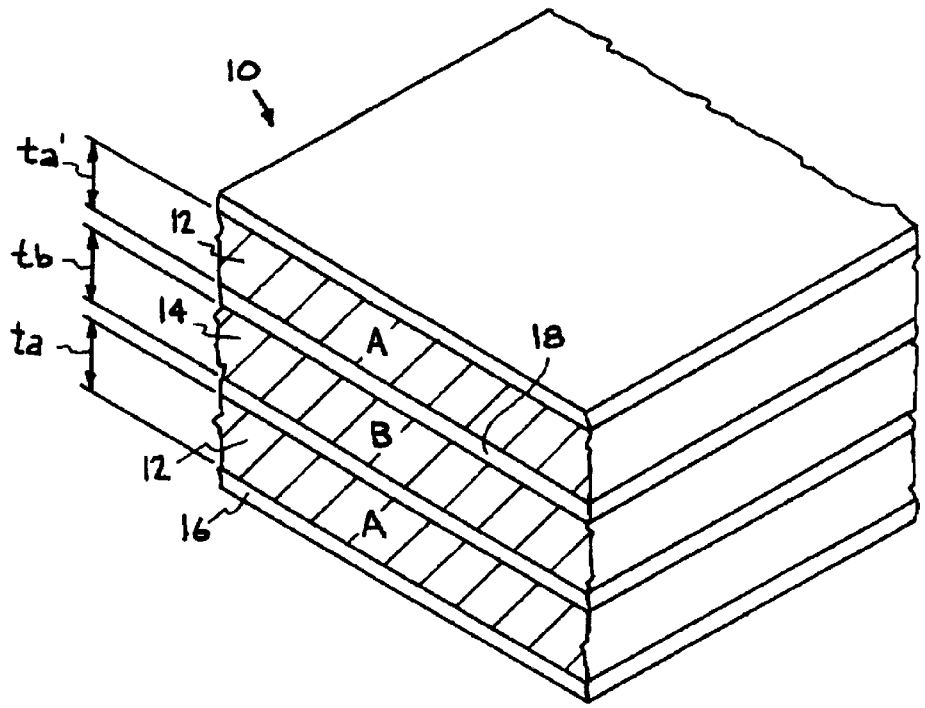

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claim 1 is determined to be patentable as amended.

Claims 2–7, dependent on an amended claim, are determined to be patentable.

New claims 8–15 are added and determined to be patentable.

1. An ignitable heterogeneous stratified structure for supporting the propagation of an internal chemical reaction along an expanding wavefront from an ignition starting point, comprising:
alternating stratiforms of a first exothermic-constituent material and a second exothermic-constituent material fused together as a whole with a mutual interface of said first exothermic-constituent material reacted with said second exothermic-constituent material, wherein said first exothermic-constituent material independently has a uniform thickness "$t_a$" in the range of 20–10,000 Å (0.002–1.0 μm), said second exothermic-constituent material independently has a uniform thickness "$t_b$" in the range of 20–10,000 Å (0.002–1.0 μm), said interface of reacted first and second exothermic-constituent materials independently has a thickness "$t_i$" in the range of [3] 5–180 Å ([0.0003] 0.0005–0.018 μm), wherein a recurring interval "D" that can occur more than once in a single structure is equal to $t_a+t_b+2t_i$ and is in the range of 50–20,000 Å (0.005–2.0 μm);
wherein said first and second exothermic-constituent materials are limited to materials that can entirely provide between themselves a self-sustained exothermic chemical reaction once started by an externally-sourced ignition; and
said stratified structure is capable of creating a predictable velocity "V" in the range of 0.2–100 meters per second that depends on the relative proportions of said thicknesses of said first and second exothermic-constituent materials "$t_a$" and "$t_b$", and said thickness "$t_i$" of said interface of reacted first and second exothermic-constituent materials, expressed mathematically as, $$\frac{K\left(1-\frac{2t_i}{D}\right)}{D^n} = V,$$

where said recurring interval "D" equals $t_a+t_b+2t_i$, "K" is an energy release constant having a range of 100–20,000 meters Å/sec, and the exponent "n" is a constant that ranges from 0.8 to 1.2.

8. *The structure of claim 1, wherein said interface of reacted first and second exothermic-constituent materials independently has a thickness "$t_i$" in the range of 15–180 Å (0.00015–0.018 μm).*

9. *An ignitable heterogeneous stratified structure for supporting the propagation of an internal chemical reaction along an expanding wavefront from an ignition starting point, comprising:*
*alternating stratiforms of a first exothermic-constituent material and a second exothermic-constituent material fused together as a whole with a mutual interface of said first exothermic-constituent material reacted with said second exothermic-constituent material, wherein said first exothermic-constituent material independently has a uniform thickness "$t_a$" in the range of 20–10,000 Å (0.002–1.0 μm), said second exothermic-constituent material independently has a uniform thickness "$t_b$" in the range of 20–10,000 Å (0.002–1.0 μm), said interface of reacted first and second exothermic-constituent materials independently has a thickness "$t_i$" in the range of 3–180 Å (0.0003–0.018 μm), wherein a recurring interval "D" that can occur more than once in a single structure is equal to $t_a+t_b+2t_i$ and is in the range of 6.0 $t_i \geq D \geq 3.0\ t_i$;*
*wherein said first and second exothermic-constituent materials are limited to materials that can entirely provide between themselves a self-sustained exothermic chemical reaction once started by an externally-sourced ignition; and*
*said stratified structure is capable of creating a predictable velocity "V" in the range of 0.2–100 meters per second that depends on the relative proportions of said thicknesses of said first and second exothermic-constituent materials "$t_a$" and "$t_b$", and said thickness "$t_i$" of said interface of reacted first and second exothermic-constituent materials, expressed mathematically as,*

$$V = K(1-2t_i/D)/D^n$$

*where said recurring interval "D" equals $t_a+t_b+2t_i$, "K" is an energy release constant having a range of 100–20,000 meters Å/sec, and the exponent "n" is a constant that ranges from 0.8 to 1.2.*

10. *The structure of claim 9, wherein said interface of reacted first and second exothermic-constituent materials independently has a thickness "$t_i$" in the range of 15–180 Å (0.0015–0.018 μm).*

11. *The structure of claim 9, wherein the stratified structure is capable of creating said ignition starting point with an ignition temperature "$T_a$" in the range of 200° C.–1500° C. with total energies ΔH in the range of 50–5,000 joules per gram, expressed mathematically as,*

$$\Delta H = \Delta H_f (1-2\ t_i/D).$$

12. *The structure of claim 9, wherein the stratified structure is capable of creating said internal chemical reaction with predictable available heats of formation $\Delta H_f$ in the range of 10K–200K joules per mole that are dependent on particular relative thickness combinations of said first and second exothermic-constituent materials "$t_a$" and "$t_b$", and said interface of reacted first and second exothermic-constituent materials "$t_i$", expressed mathematical as,*

$$\Delta H = \Delta H_f (1-2\ t_i/D)$$

*where ΔH=total energy.*

13. *The structure of claim 9, further comprising: an isolation stratum interposed and fused between the alter-* nating stratiforms of said first and second exothermic-constituent materials fused together as a whole, and providing for attenuation of said internal chemical reaction.

14. The structure of claim 9, wherein said first and second exothermic-constituent materials comprise thermalizations of their respective elemental atoms and/or molecules providing for a reduction of as-deposited energy.

15. The structure of claim 9, wherein said first exothermic-constituent material and said second exothermic-constituent material are selected to form chemical reactions resulting in at least one of $NiSi$, $VB_2$ and $TiB_2$ for heats of formation in the range of 70K–120K joules per mole, MONEL/Al 400, NiAl, PdAl, TiSn and SnV for heats of formation in the range of 45K–70K joules per mole, and ZrAl and TiAl for heats of formation in the range of 20K–45K joules per mole.

* * * * *